United States Patent
Ogawa et al.

(10) Patent No.: US 6,974,987 B2
(45) Date of Patent: Dec. 13, 2005

(54) SEMICONDUCTOR DEVICE

(75) Inventors: Hisashi Ogawa, Katano (JP); Isao Miyanaga, Nara (JP); Koji Eriguchi, Ritto (JP); Takayuki Yamada, Yao (JP); Kazuichiro Itonaga, Oume (JP); Yoshihiro Mori, Neyagawa (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 3 days.

(21) Appl. No.: 10/477,924

(22) PCT Filed: Feb. 14, 2003

(86) PCT No.: PCT/JP03/01602

§ 371 (c)(1),
(2), (4) Date: Nov. 18, 2003

(87) PCT Pub. No.: WO03/069675

PCT Pub. Date: Aug. 21, 2003

(65) Prior Publication Data
US 2004/0150025 A1    Aug. 5, 2004

(30) Foreign Application Priority Data
Feb. 14, 2002 (JP) .............................. 2002-036086

(51) Int. Cl.$^7$ .......................................... H01L 27/108

(52) U.S. Cl. ........................ 257/296; 257/68; 257/71; 257/298; 257/301; 257/311; 257/905; 257/908

(58) Field of Search ................. 257/68–71, 296–313, 257/905–908

(56) References Cited

U.S. PATENT DOCUMENTS

| | | | | |
|---|---|---|---|---|
| 5,998,822 A | * | 12/1999 | Wada | 257/301 |
| 6,075,720 A | * | 6/2000 | Leung et al. | 365/149 |
| 6,312,982 B1 | * | 11/2001 | Takato et al. | 438/238 |
| 6,466,502 B1 | * | 10/2002 | Matsumoto | 365/208 |
| 2002/0196690 A1 | | 12/2002 | Matsumoto | |

FOREIGN PATENT DOCUMENTS

| | | | |
|---|---|---|---|
| EP | 1039470 | 9/2000 | |
| JP | 5-6967 | 1/1993 | |
| JP | 7-45722 | 2/1995 | |
| JP | 8-74172 | 3/1997 | |
| JP | 10-98164 | 4/1998 | |
| JP | 100988164 A | * 4/1998 | ......... H01L 27/108 |
| JP | 2000-307086 A | 11/2000 | |
| JP | 2000-339963 A | 12/2000 | |
| JP | 2002-158295 | 5/2002 | |
| WO | WO 00/10171 | 2/2000 | |

* cited by examiner

Primary Examiner—Andy Huynh
(74) Attorney, Agent, or Firm—McDermott Will & Emery LLP (57) ABSTRACT

A memory cell transistor and a trench capacitor are provided in a memory region, and both transistors of CMOS are provided in a logic circuit region. There are provided a bit line contact 31 and a bit line 32 extending on an inter-level dielectric 30. In a memory cell transistor, a source diffusion layer 18 is covered with two dielectric sidewalls 25a and 25b in the memory cell transistor so that no silicide layer is formed on the source diffusion layer 18. A plate contact 31 is provided to pass through the inter-level dielectric 30 and connect a shield line 33 to a plate electrode 16b. The shield line 33 is arranged in the same interconnect layer as the bit line 32.

15 Claims, 6 Drawing Sheets

IIa-IIa cross section    R memo    IIb-IIb cross section

SEMICONDUCTOR DEVICE

TECHNICAL FIELD

The present invention relates to a semiconductor device and a method for fabricating the same, and more particularly to those that are applied to a so-called DRAM-embedded logic LSI in which a DRAM is embedded in a logic chip.

BACKGROUND ART

In recent years, DRAM-embedded devices in which a high-performance logic circuit and a DRAM memory are combined together have been made practical for multimedia devices requiring miniaturization, a high memory capacity and a high data transfer rate. The DRAM-embedded devices are broadly classified into a trench capacitor type in which a capacitor as an information storage unit of a DRAM memory cell is provided in a trench of a semiconductor substrate and a stack capacitor type in which a capacitor and an electrode are three-dimensionally stacked above a principal surface of a semiconductor substrate.

On the other hand, attention is again focused on a device in which a so-called planar (MOS structure) DRAM and a logic circuit are merged using a gate dielectric as a capacitance dielectric and a gate electrode as a plate electrode, because it is a device in which a memory cell can be formed more easily.

PROBLEMS TO BE SOLVED

However, the above-described known DRAM-embedded logic circuits have the following problems.

Processes for fabricating the trench-capacitor-type and stack-type merged DRAM/logic devices additionally involve complicated process steps to form a memory cell capacitor as well as a memory cell transistor. Consequently, the yield enhancement of the devices becomes increasingly difficult in addition to prolonging the development period for design changes or the like and the period required for fabrication of the devices, leading to an increase in production cost.

In regard to a planar-type DRAM-embedded device, although a process for fabricating the same is short and simple, the size of the memory cell becomes larger than that of the stack capacitor type or the trench capacitor type. Therefore, it becomes hard to embed a high-capacity DRAM in a logic circuit.

DISCLOSURE OF INVENTION

It is an object of the present invention to provide a semiconductor device for easily realizing a device in which a DRAM having a desired capacitance is embedded in a logic circuit without adding complicated process steps and a method for fabricating the same.

A semiconductor device of the present invention comprises a DRAM memory cell including a memory cell transistor and a capacitor in a semiconductor layer, wherein the memory cell transistor comprises: a gate dielectric provided on the semiconductor layer; a gate electrode provided on the gate dielectric; a source diffusion layer and a drain diffusion layer provided to either side of the gate electrode in the semiconductor layer; and a first sidewall covering the sides of the gate electrode, the capacitor comprises: a plate electrode including a lower part with which a capacitor trench formed by entrenching the semiconductor layer is filled and an upper part opposed to the gate electrode; a capacitance dielectric formed along the wall surfaces of the capacitor trench below the plate electrode and interposed between the lower part of the plate electrode and the semiconductor layer; and a second sidewall consisting of a dielectric covering the sides of the upper part of the plate electrode, and the whole source diffusion layer is covered with the first and second sidewalls.

With this structure, there can be obtained a DRAM memory cell having a small area and a large capacitance while having a trench capacitor structure in which a level difference on the substrate is small. In addition, since the source diffusion layer is covered with the first and second sidewalls, it can be restrained that the source diffusion layer is turned into suicide and impurities enter the source diffusion layer. Therefore, a leakage current of the memory cell can be suppressed.

The semiconductor device may further comprise a diffusion layer for a storage node that is formed along the wall surfaces of the capacitor trench in the semiconductor layer so as to be opposed to the lower part of the plate electrode via the capacitance dielectric.

The drain diffusion layer includes a first impurity diffusion layer formed in self-alignment with the gate electrode and a second impurity diffusion layer formed in self-alignment with the first sidewall and containing higher-concentration impurities than those of the first impurity diffusion layer; and the source diffusion layer is formed in self-alignment with the gate electrode. This provides effects such as enhanced reliability caused by relaxation of an electric field in the drain diffusion layer during operation of the memory cell transistor.

A silicide layer is provided on at least a part of the drain diffusion layer of the memory cell transistor; and no silicide layer is provided on the source diffusion layer of the memory cell transistor. Therefore, a current leakage can be reduced while the resistance of the drain contact can be reduced.

The semiconductor device further comprises: an inter-level dielectric covering the memory cell transistor and the memory cell capacitor; plural bit lines formed on the inter-level dielectric; a shield line interposed between the plural bit lines on the inter-level dielectric, the shield line being formed of a conductor film in common with the bit lines; and a connection member passing through the inter-level dielectric and connecting the shield line to the plate electrode. Since the shield line is connected through the plate contact to the plate electrode, the potential of the plate electrode can be fixed via the shield line. Therefore, the potential of the plate electrode can be refrained from varying frequently, and a charge storage capacity in the capacitance dielectric can be improved. In addition, since the shield line is formed of a conductor film in common with the bit lines, the adoption of this structure does not cause the number of fabricating process steps to increase.

The plate electrode of the capacitor and the gate electrode of the memory cell transistor are formed of a common conductor film. Therefore, simplified fabricating process enables the production cost and the memory size to be reduced.

The semiconductor device further comprises: a logic transistor including a gate electrode provided on the semiconductor layer and source and drain regions provided in the semiconductor layer, wherein the gate electrode of the logic transistor is formed of a conductor film in common with the plate electrode of the capacitor and the gate electrode of the memory cell transistor. Therefore, a so-called merged DRAM/logic semiconductor device can be provided at low cost.

The gate dielectric and the capacitance dielectric are formed using a common dielectric. Therefore, production cost can be reduced.

A method for fabricating a semiconductor device of the present invention comprising: a memory cell transistor including a gate dielectric, a gate electrode, a source diffusion layer and a drain diffusion layer; and a capacitor including a plate electrode and a capacitance dielectric, comprises the steps of (a) etching a part of the semiconductor layer to form a capacitor trench; (b) etching a part of the semiconductor layer, after the step (a), by using an underlying oxide film made of a thermal oxide film and an etching mask film with both of which the capacitor trench is filled to form an isolation trench and thereafter filling the isolation trench with a dielectric to form a trench isolation; (c) removing the etching mask film and the underlying oxide film, individually, after the step (b); (d) forming a capacitance dielectric on the wall of the capacitor trench after the step (c); (e) forming a conductor film in the capacitor trench and over the top surface of the semiconductor layer after the step (d); and (f) patterning the conductor film to form a gate electrode of the memory cell transistor on an active region and also form a plate electrode of a capacitor with which the capacitor trench is filled.

According to this method, two times of oxide film formations and removals allow the wall surface of the capacitor trench, i.e., the surface of the diffusion layer for a storage node, to be cleaned and smoothed, thereby obtaining a capacitor having a capacitance dielectric whose thickness is relatively uniform and having a steady capacitance property.

The method for fabricating a semiconductor device further comprises the steps of: (g) implanting impurity ions into the active region, after the step (f), by using the gate electrode as a mask to form two first impurity diffusion layers in respective regions of the semiconductor layer located to both sides of the gate electrode; and (h) forming first and second dielectric sidewalls after the step (g), the first and second dielectric sidewalls respectively covering the sides of the gate electrode and the sides of the plate electrode and fully covering one of the two first impurity diffusion layers located between the gate electrode and the plate electrode. Therefore, in later process steps, a silicide layer is refrained from being formed on one of the first impurity diffusion layers that becomes a source diffusion layer, and impurities are refrained from entering the one first impurity diffusion layer.

The method for fabricating a semiconductor device further comprises the step of (i) implanting impurity ions into the other of the two first impurity diffusion layers in the active region with a higher concentration than in the step (g), after the step (h), by using the gate electrode and the first and second sidewalls as masks, thereby forming a second impurity diffusion layer. Therefore, the drain diffusion layer of the memory cell transistor is composed of the first and second impurity diffusion layers. As a result, a memory cell transistor is formed to have a high capability of relaxing an electric field during operation.

The method for fabricating a semiconductor device further comprises the step of (j) turning the upper part of the second impurity diffusion layer into silicide to form a silicide layer after the step (i). Therefore, a memory cell having a small drain contact resistance and a small leakage current is formed.

The method for fabricating a semiconductor device comprises the steps of: (k) forming an inter-level dielectric covering the plate electrode and the gate electrode; and (l) forming a bit line contact passing through the inter-level dielectric and connected to the drain diffusion layer, a bit line, a plate contact passing through the inter-level dielectric and connected to the plate electrode, and a shield line. Therefore, a capacitor is formed to have a high capability of suppressing variations in the potential of the plate electrode and a high charge storage capacity without causing the number of fabricating process steps to increase.

The method for fabricating a semiconductor device may further comprise the steps of: forming an implantation protection oxide film on the wall of the capacitor trench by a thermal oxidation method after the step (a) and before the step (c) and thereafter introducing impurities into a region of the semiconductor layer located below the implantation protection oxide film to form a diffusion layer for a storage node; and removing the implantation protection oxide film after forming the diffusion layer for a storage node.

In the step of forming a diffusion layer for a storage node, ion implantation or plasma doping of the impurities can be performed from above the implantation protection oxide film.

The semiconductor device further comprises a logic transistor including a gate electrode and source and drain diffusion layers; in the step (b), a trench isolation is formed also in the logic transistor formation region; in the step (e), the conductor film is formed also in the logic transistor formation region; and in the step (f), a gate electrode of the logic transistor is formed of the conductor film. Therefore, a merged DRAM/logic semiconductor device can be formed in simple process steps.

In the step (d), the gate dielectric is formed on the active region of the memory cell transistor by using a film in common with the capacitance dielectric. Therefore, production cost can be reduced.

BEST MODE FOR CARRYING OUT THE INVENTION

-Embodiment 1-

Figure 1:
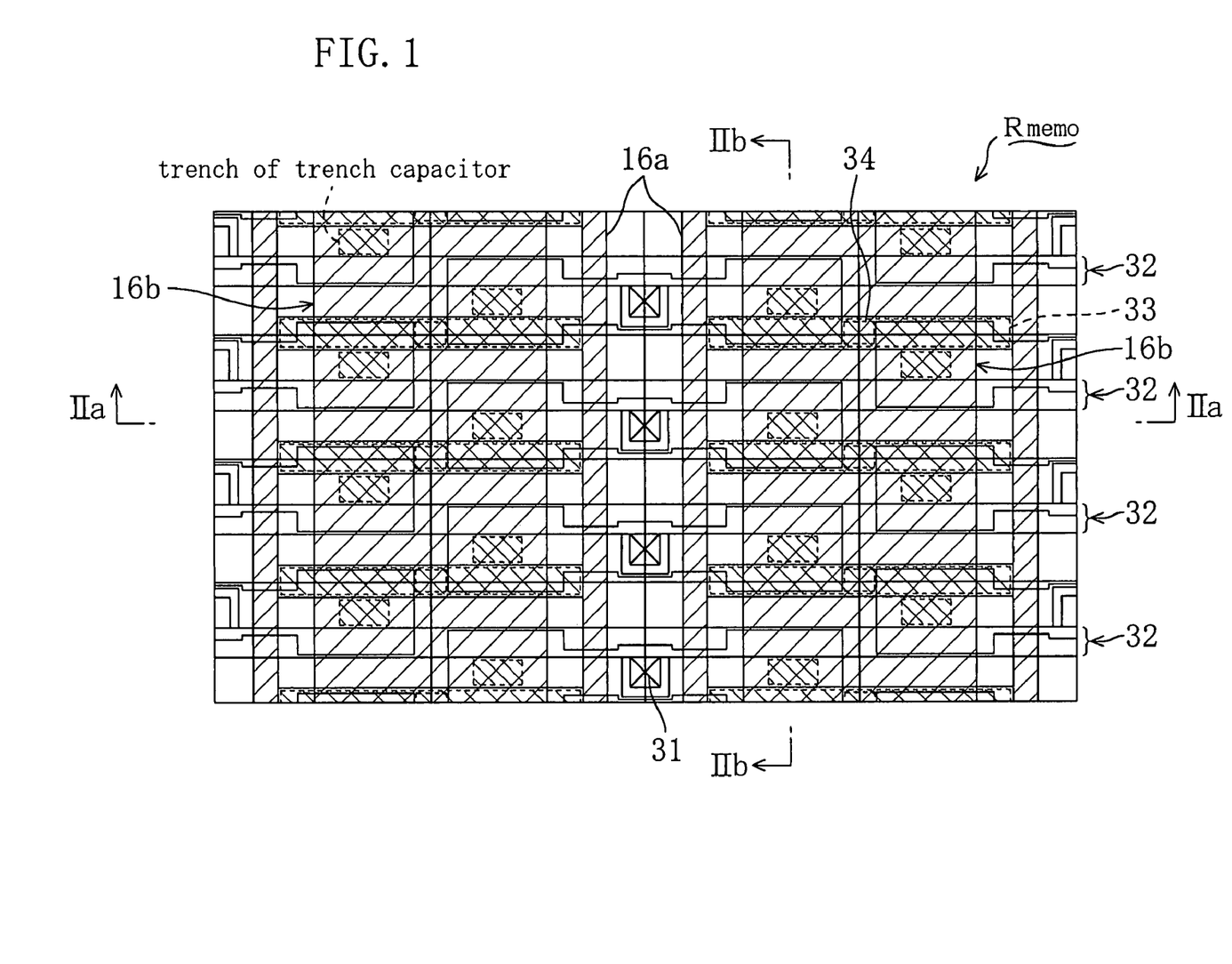
FIG. 1 is a plan view illustrating the structure of a memory of a semiconductor device according to a first embodiment of the present invention.
Figure 2A:
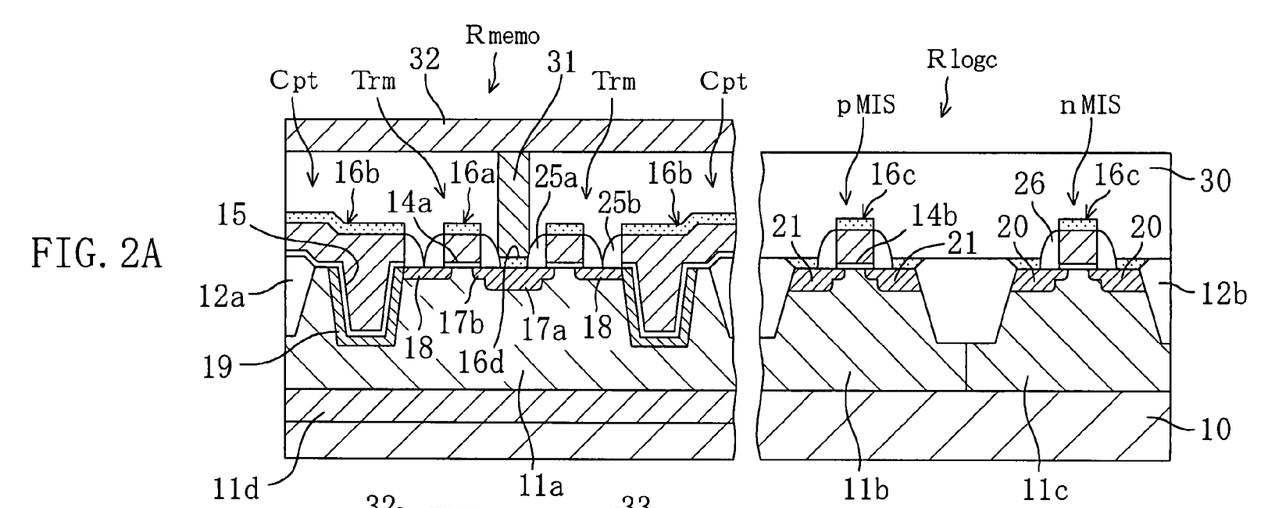
FIGS. 2A and 2B are cross sectional views taken along the lines IIa—IIa and IIb—IIb shown in FIG. 1, respectively.
Figure 2B:
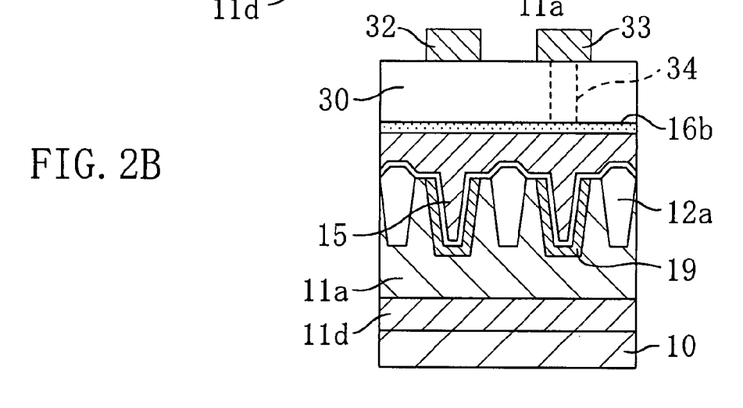

FIG. 1 is a plan view illustrating the structure of a memory of a semiconductor device according to a first embodiment of the present invention. FIGS. 2A and 2B are cross sectional views taken along the lines IIa—IIa and IIb—IIb shown in FIG. 1, respectively. Although FIG. 2A illustrates cross sectional structures of a memory region Rmemo and a logic circuit region Rlogc of a semiconductor device, FIGS. 1 and 2B do not illustrate a planar structure and a cross sectional structure of the logic circuit region Rlogc.

As shown in FIGS. 1, 2A and 2B, the semiconductor device of this embodiment includes a p-type silicon substrate 10, a p-well 11a provided in the memory region Rmemo of the silicon substrate 10, an n-well 11b and a p-well 11c both provided in the logic circuit region Rlogc of the silicon substrate 10, a deep n-well 11d surrounding the bottom part of the p-well 11a located in the memory region Rmemo, i.e., the device has a so-called triple-well structure. The device also includes a shallow trench isolation 12a defining an active region in the memory region Rmemo and a shallow trench isolation 12b defining an active region in the logic circuit region Rlogc.

In the memory region Rmemo, a memory cell transistor Trm including a gate electrode 16a, a gate dielectric 14a, a dielectric sidewall 25a, a low-concentration drain diffusion layer 17b containing n-type impurities with low concentration, a high-concentration drain diffusion layer 17a containing n-type impurities with high concentration, a source diffusion layer 18 and a silicide layer 16d, and a trench capacitor Cpt including a plate electrode 16b, an n-type diffusion layer 19 functioning as a storage node, a capacitance dielectric 15 and a dielectric sidewall 25b are arranged on the p-well 11a. Thus, a drain diffusion layer is composed of the high-concentration drain diffusion layer 17a and the low-concentration drain diffusion layer 17b, and a drain region of the memory cell transistor is composed of the high-concentration drain diffusion layer 17a, the low-concentration drain diffusion layer 17b and the silicide layer 16d. On the other hand, the source diffusion layer 18 is composed of only the low-concentration impurity diffusion layer containing the n-type impurities with low concentration as a whole. Since the source diffusion layer 18 is covered with the two dielectric sidewalls 25a and 25b, no silicide layer is formed on the source diffusion layer 18. Therefore, a source region is composed of only the source diffusion layer 18.

In the logic circuit region Rlogc, there are provided a p-channel type MIS transistor (pMIS) including a gate electrode 16c, a gate dielectric 14b, a dielectric sidewall 26 and p-type source and drain diffusion layers 21, and an n-channel type MIS transistor (nMIS) including a gate electrode 16c, a gate dielectric 14b, a dielectric sidewall 26 and n-type source and drain diffusion layers 20.

An inter-level dielectric 30 is deposited on the whole substrate. There are provided a bit-line contact 31 passing through the inter-level dielectric 30 and connected to the high-concentration drain diffusion layer 17a of the memory cell transistor Trm located in the memory region Rmemo, and a bit line 32 connected to the bit-line contact 31 and extending on the inter-level dielectric 30. The structure of this memory region Rmemo is a so-called open bit line structure.

Also in the logic circuit region Rlogc, there are provided a source contact and a drain contact both passing through the inter-level dielectric 30 and reaching the source and drain diffusion layers 19 and 20, a gate contact passing through the inter-level dielectric 30 and coming into contact with the gate electrode 16c, and the like. However, since these members do not relate to the essence of the present invention, an illustration thereof is not given.

A first characteristic of this embodiment lies in that the source diffusion layer 18 is covered with the two sidewalls 25a and 25b so that no silicide layer is formed on the source diffusion layer 18, and that the source region does not include a diffusion layer containing impurities with high concentration equivalent to that of the high-concentration drain diffusion layer 17a but includes only the source diffusion layer 18 containing impurities with low concentration equivalent to that of the low-concentration drain diffusion layer 17b. A second characteristic of this embodiment lies in that there are provided a shield line 33 extending generally parallel to the bit line 32 on the inter-level dielectric 30 in the memory region Rmemo, and a plate contact 31 passing through the inter-level dielectric 30 and connecting the shield line 33 to the plate electrode 16b, and this shield line 33 is arranged in the same interconnect layer as the bit line 32. The shield line 33 is connected to a further upper interconnect (not shown) and is constructed so as to apply an intermediate voltage (for example, VDD/2) between a power supply voltage VDD and a ground voltage Vss from this upper interconnect through the shield line 33 to the plate electrode 16b. The shield line 33 is a necessary member especially in the open bit line structure and is inherently provided to suppress interference of electrical signals between bit lines 32 located to both sides of the shield line 33.

According to this embodiment, since the source diffusion layer 18 is covered with the two dielectric sidewalls 25a and 25b, it can be restrained that in process steps after sidewall formation, the source diffusion layer 18 is turned into silicide and various types of impurities enter the source diffusion layer 18. Since the entry of the various types of impurities can be suppressed and no silicide layer is formed on the source diffusion layer 18, a current leakage through the source diffusion layer 18 can be reduced.

The shield line 33 is connected via a plate contact 34 to the plate electrode 16b, and the potential of the plate electrode 16b is fixed through the shield line 33. That is, according to this embodiment, the potential of the plate electrode 16b is refrained from varying frequently, and the charge storage capacity in the capacitance dielectric can be enhanced. This shield line 33 is obtained by patterning the same conductor film as that of the bit line 32 as will be described later. Therefore, the adoption of this structure does not cause an increase in the number of process steps. Thus, according to this embodiment, the potential of the plate electrode 16b is refrained from varying frequently while a layout of a so-called open bit line system is employed. The plate electrode 16b is formed of the conductor film in common with the gate electrode 16a of the memory cell transistor, resulting in reduction in the size of the memory cell.

Next, a description will be given of a method for fabricating a semiconductor device according to a first embodiment of the present invention. FIGS. 3A through 3E and 4A through 4D are cross sectional views illustrating process steps for fabricating a semiconductor device according to this embodiment. However, FIGS. 3A through 3E and 4A through 4D illustrate only the memory region Rmemo but do not illustrate the logic circuit region Rlogc.

Figure 3A:
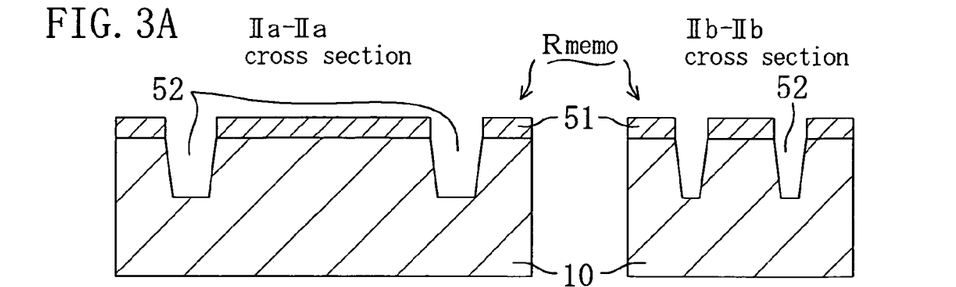
FIGS. 3A through 3E are cross sectional views illustrating the first half of process steps for fabricating a semiconductor device according to the first embodiment.

Initially, in a process step shown in FIG. 3A, a $SiO_2$ film having, for example, a thickness of 200 nm is formed on the p-type silicon substrate 10, and thereafter a resist mask (not shown) having a region of the substrate that is to form a capacitor trench opened is formed. The $SiO_2$ film is patterned using the resist mask, thereby forming an oxide film mask 51. A capacitor trench 52 is formed in the silicon substrate 10 by dry etching using the oxide film mask 51.

Figure 3B:
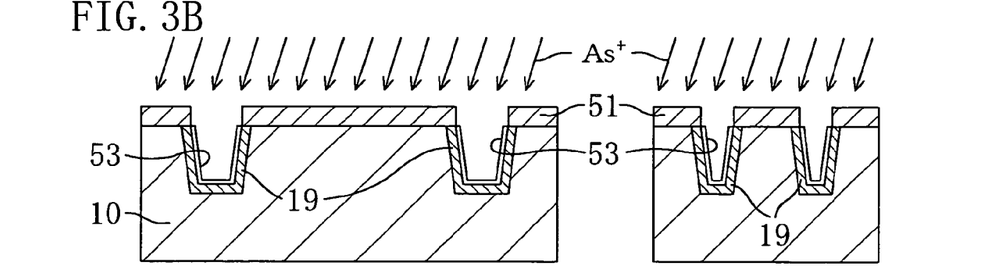

Next, in a process step shown in FIG. 3B, an implantation protection oxide film 53 having a thickness of approximately 20 nm is formed on an exposed part of the silicon substrate 10 (the wall surface of the capacitor trench 52) by thermal oxidation. This implantation protection oxide film 53 is for rounding an edge part of the capacitor trench 52 and also cleaning and smoothing its surface. Next, arsenic ions (As⁺) are implanted using the oxide film mask 51 as an implantation mask, thereby forming an n-type diffusion layer 19 that becomes a storage node.

Figure 3C:
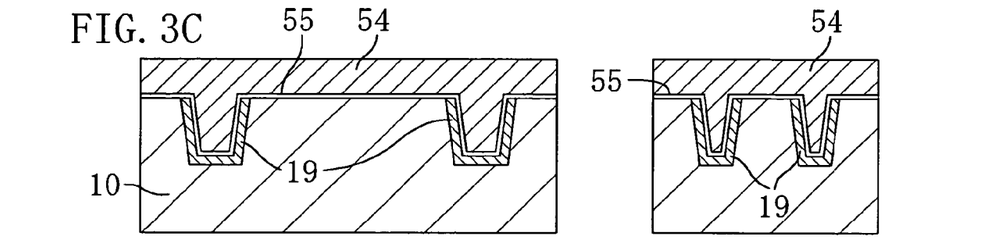

Next, in a process step shown in FIG. 3C, after the oxide film mask 51 and the implantation protection oxide film 53 are removed, a silicon oxide film 55 that is a thermal oxide film having a thickness of 20 nm and a silicon nitride film 54 having a thickness of 95 nm are successively formed on the substrate. Thereafter, a part of the silicon nitride film 54 located above the trench is planarized.

Figure 3D:
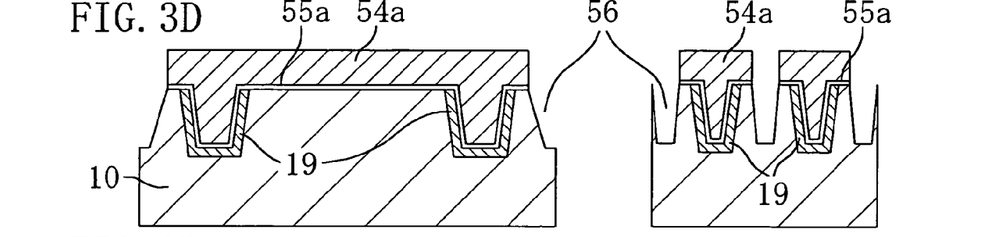

Next, in a process step shown in FIG. 3D, a resist mask (not shown) having a region of the substrate that is to form a shallow trench opened is formed on the silicon nitride film 54, and a nitride film mask 54a and an underlying oxide film 55a are formed by dry etching using the resist mask. Dry etching is performed using the nitride film mask 54a or the like as a mask, thereby forming a shallow trench 56 in the silicon substrate 10. At this time, a shallow trench is formed also in the logic circuit region Rlogc, although this is not shown.

Figure 3E:
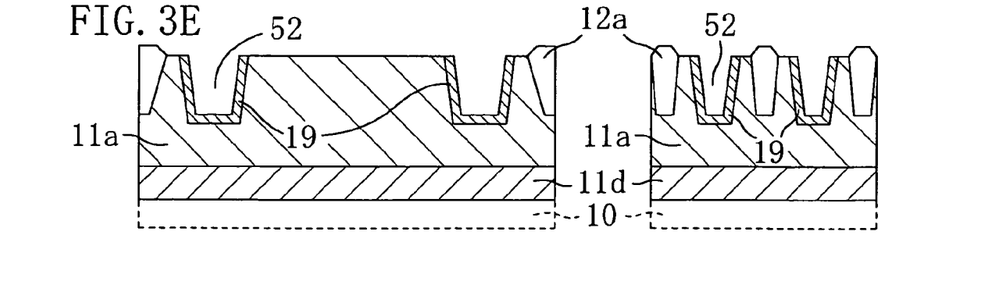

Next, in a process step shown in 3E, after a silicon oxide film (not shown) is deposited on the substrate, the silicon oxide film and the nitride film mask 54a are planarized by CMP. Thereby, the shallow trench 56 is filled with the silicon oxide film so as to form a shallow trench isolation 12a. At this time, a shallow trench isolation 12b as shown in FIG. 2A is formed also in the logic circuit region Rlogc. Thereafter, the nitride film mask 54a is selectively removed by wet etching, and then the underlying oxide film 55a is removed by wet etching. At this time, the surface of the shallow trench isolation 12a is also etched. However, this is only etched by a slight thickness relative to the whole thickness. Phosphorous ions (P⁺) are implanted into the memory region Rmemo and a part of the logic circuit region Rlogc of the silicon substrate 10 by using a resist mask (not shown) covering a part of the logic circuit region Rlogc, thereby forming a deep n-well 11d (see FIG. 2A) over the memory region Rmemo and a part of the logic circuit region Rlogc. Boron ions (B⁺) are implanted into the memory region Rmemo and a part of the logic circuit region Rlogc of the silicon substrate 10 by using a resist mask (not shown) covering a p-channel type transistor formation region located in the logic circuit region Rlogc, thereby forming a p-well 11a located in the memory region Rmemo and a p-well 11c located in the logic circuit Rlogc (see FIG. 2A). Phosphorous ions (P⁺) are implanted using a resist mask (not shown) covering the memory region Rmemo and an n-channel type transistor formation region of the logic circuit region Rlogc, thereby forming an n-well 11b (see FIG. 2A) in the logic circuit region Rlogc. In the memory region Rmemo and the logic circuit region Rlogc, impurities for channel stoppers are implanted immediately below the shallow trench isolation 12a and 12b, and impurities for punch-through stoppers are implanted below channel regions of the transistors, although they are not shown in FIG. 2A.

In this embodiment, after the shallow trench isolation 12a is formed, the deep well 11d, the p-wells 11a and 11c and the n-well 11b are formed. However, these wells may be formed before the capacitor trench 52 shown in FIG. 3A is formed.

Figure 4A:
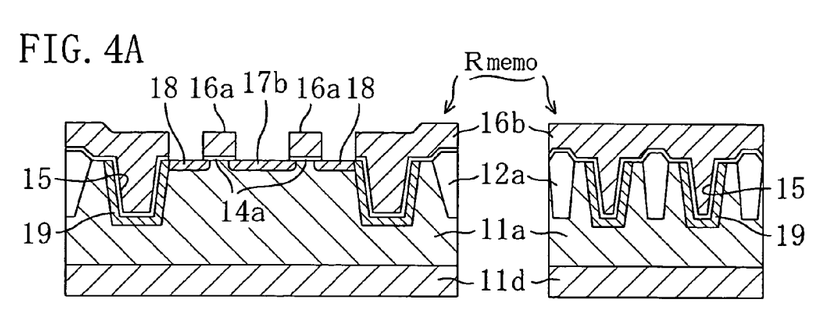
FIGS. 4A through 4D are cross sectional views illustrating the latter half of process steps for fabricating a semiconductor device according to the first embodiment.

Next, in a process step shown in FIG. 4A, after a thermal oxide film of a thickness of 2 through 6 nm, which serves as a capacitance dielectric 15 and a gate dielectric 14a both located in the memory region Rmemo and a gate dielectric 14b located in the logic circuit region Rlogc, is formed, a polysilicon film having a thickness of 200 nm is deposited thereon. Thereafter, the polysilicon film and the thermal oxide film are patterned, thereby forming the capacitance dielectric 15 and the plate electrode 16b of a trench capacitor and the gate dielectric 14a and a gate electrode 16a of a memory cell transistor in the memory region Rmemo. The gate dielectric 14b and a gate electrode 16c for each of a p-channel type MIS transistor and an n-channel type MIS transistor are formed in the logic circuit region Rlogc (see FIG. 2A), although they are not shown in FIG. 4A. Prior to the patterning of the polysilicon film, impurity ions may be implanted into part of the polysilicon film which is to become gate electrodes of both the p-channel type MIS transistor and the n-channel type MIS transistor or a gate electrode of the p-channel type MIS transistor, so as to reduce the resistance of the gate electrode or gate electrodes.

Thereafter, arsenic ions are implanted into the memory cell transistor located in the memory region Rmemo and the n-channel type MIS transistor located in the logic circuit region Rlogc with a concentration for extension. Thereby, a low-concentration drain diffusion layer 17b and a source diffusion layer 18 are formed in the memory region Rmemo, and an extension region of the n-channel type MIS transistor is formed in the logic circuit region Rlogc. At this time, the source diffusion layer 18 of the memory cell transistor is formed so as to overlap with the n-type diffusion layer 19 that is the storage node. In the logic circuit region Rlogc, boron fluoride ions are implanted with a concentration for extension of the p-channel type MIS transistor, thereby forming an extension region of the p-channel type MIS transistor.

Figure 4B:
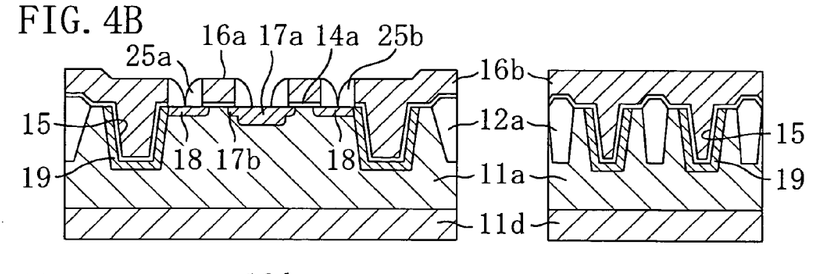

Next, in a process step shown in FIG. 4B, a silicon oxide film and a silicon nitride film are successively deposited on the whole substrate, and thereafter anisotropic etching is performed, thereby forming a dielectric sidewall 25a on the sides of the gate electrode 16a of the memory cell transistor. At this time, a dielectric sidewall 25b is formed also on the sides of the plate electrode 16b of the trench capacitor. The source diffusion layer 18 of the memory cell transistor is covered with the two dielectric sidewalls 25a and 25b. In the logic circuit region Rlogc, a dielectric sidewall 26 is formed also on the sides of the gate electrode 16c of each of the p-channel type MIS transistor and the n-channel type MIS transistor (see FIG. 2A). Thereafter, arsenic ions (As⁺) are implanted using the gate electrode 16a and the dielectric sidewalls 25a and 25b as masks, thereby forming a high-concentration drain diffusion layer 17a in the low-concentration drain diffusion layer 17b of the memory region Rmemo and in a region of the substrate below the low-concentration drain diffusion layer 17b. However, the source diffusion layer 18 of the memory cell transistor is covered with the two dielectric sidewalls 25a and 25b. Therefore, in this process step, the source diffusion layer 18 is not doped with n-type impurities of high concentration, resulting in no high-concentration source diffusion layer being formed.

Also in the logic circuit region Rlogc, impurity ions for high-concentration source and drain diffusion layers of the p-channel type MIS transistor and the n-channel type MIS transistor are implanted, thereby forming the source and drain diffusion layers 20 and 21 (see FIG. 2A).

Figure 4C:
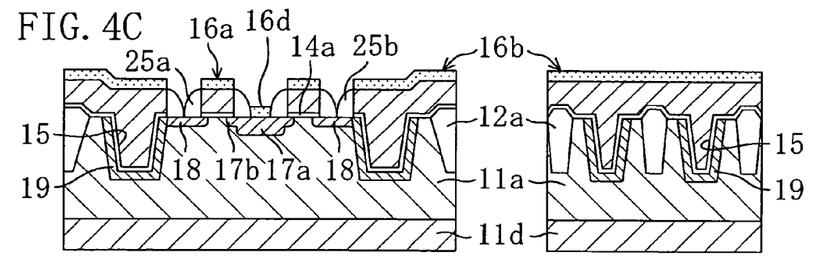

Next, in a process step shown in FIG. 4C, a salicide process step is carried out to reduce the resistance of each layer. At this time, in the memory region Rmemo, the upper parts of the gate electrode 16a and the plate electrode 16b become a cobalt silicide layer, and the upper part of the drain diffusion layer 17a becomes a cobalt silicide layer 16d. As shown in FIG. 2A, in the logic circuit region Rlogc, the upper parts of the gate electrode 16c and source and drain diffusion layers 20 and 21 become cobalt silicide layers. On the other hand, the source diffusion layer 18 of the memory cell transistor is covered with the two dielectric sidewalls 25a and 25b. Therefore, in this process step, no silicide layer is formed on the source diffusion layer 18.

Figure 4D:
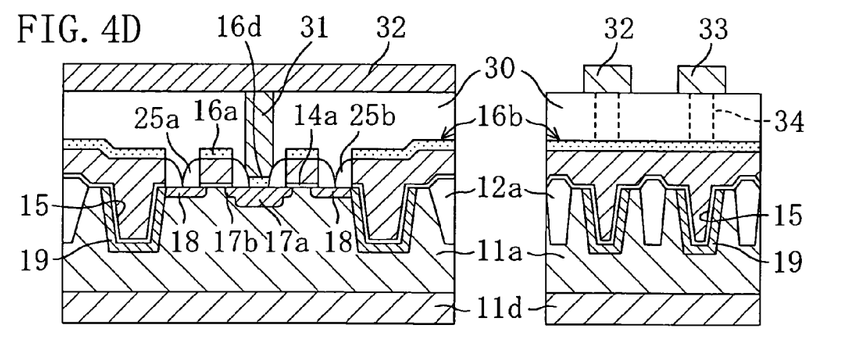

Next, in a process step shown in FIG. 4D, after a silicon oxide film having a thickness of 900 nm is deposited on the substrate, the deposited film is planarized by CMP so as to form an inter-level dielectric 30. Contact holes are formed which pass through the inter-level dielectric 30 and reach the cobalt suicide layer 16d on the high-concentration drain diffusion layer 17a and (the suicide layer of) the plate electrode 16b both located in the memory region Rmemo, respectively. Thereafter, each of contact holes is filled with tungsten or the like, thereby forming a bit line contact 31 and a plate contact 34. Also in the logic circuit region Rlogc, source and drain contacts are formed (not shown in FIG. 2A). Thereafter, an aluminum alloy film (or a copper alloy film) having a thickness of 400 nm is deposited on the inter-level dielectric 30, and then the deposited film is patterned to form a bit line 32 and a shield line 33. Thereby, the structure of the semiconductor device shown in FIGS. 1, 2A and 2B can be obtained.

Although in this embodiment a description is given using a thermal oxide film as the gate dielectric 14a and the capacitance dielectric 15, for example, an oxide film, an oxynitride film, an ON film obtained by successively stacking an oxide film and a nitride film, an ONO film obtained by successively stacking an oxide film, a nitride film and an oxide film, an $HfO_2$ film or a $ZrO_2$ film that are high-dielectric films, or the like can be employed as a common dielectric. In the logic circuit region Rlogc, plural kinds of gate dielectrics of different thicknesses, such as two or three kinds, are often provided in accordance with types of transistors. The gate dielectric 14b of each of the transistors located in the logic circuit region Rlogc may also be formed of an oxide film, an oxynitride film, an ON film obtained by successively stacking an oxide film and a nitride film, an ONO film obtained by successively stacking an oxide film, a nitride film and an oxide film, an $HfO_2$ film or a $ZrO_2$ film that are high-dielectric films, or the like.

According to the fabricating method of this embodiment, two oxidation process steps and two oxide film removal process steps are carried out in process steps shown in FIGS. 3B and 3C between the process step of forming a shallow trench as shown in FIG. 3A and the process step of forming a capacitance dielectric 15 as shown in FIG. 4A. Therefore, the corner shape of the capacitor trench can be easily rounded, and also the wall surface of the trench is cleaned and smoothed. Thus, the properties of the capacitance dielectric 15 to be formed later are improved. This improvement of the properties means that, for example, the film thickness is substantially made uniform to reduce a current leakage through the capacitance dielectric 15, and that variations in capacitance values become small to stabilize the charge storage function.

The source diffusion layer 18 is covered with the two dielectric sidewalls 25a and 25b. Therefore, it can be restrained that in the process steps after sidewall formation, the source diffusion layer 18 is turned into suicide and various types of impurities enter the source diffusion layer 18. Furthermore, since the entry of the various types of impurities can be suppressed and no silicide layer is formed on the source diffusion layer 18, a current leakage through the source diffusion layer 18 can be reduced.

Furthermore, according to the fabricating method of this embodiment, the bit line contact 31 and the plate contact 34 each passing through the inter-level dielectric 30 can be formed in a common process step, and the bit line 32 and the shield line 33 can also be formed of a common metal film at the same time. Therefore, a structure of the plate electrode 16b for stabilizing the potential thereof can be achieved without causing the number of process steps to increase.

More particularly, the capacitor trench 52 located in the memory region Rmemo can be formed before the gate dielectric of the MIS transistor located in the logic circuit region Rmemo is formed. Therefore, a DRAM-embedded logic LSI having a trench capacitor can be fabricated at low cost without making the performance of the transistor worse due to diffusion of impurities into the source and drain diffusion layers located in the logic circuit region Rlogc, or the like.

The plate electrode 16b of the trench capacitor is formed of the same conductor film (polysilicon film) as the gate electrode 16a of the memory cell transistor and the gate electrode 16c of each of the MIS transistors located in the logic circuit region Rlogc. Therefore, the process steps can be simplified.

-Second Embodiment-

Next, a description will be given of a method for fabricating a semiconductor device according to a second embodiment of the present invention. Although also in this embodiment the structure of a semiconductor device to be formed is identical with the structure shown in FIGS. 1, 2A and 2B, procedures of these process steps are different from each other. FIGS. 5A through 5C and 6A through 6C are cross sectional views illustrating process steps of fabricating a semiconductor device in this embodiment. However, FIGS. 5A through 5C and 6A through 6C illustrate only a memory region Rmemo but do not illustrate a logic circuit region Rlogc. Since also in this embodiment the thickness of each element and the concentration of impurities are identical with those of the first embodiment, a description thereof is not given.

Figure 5A:
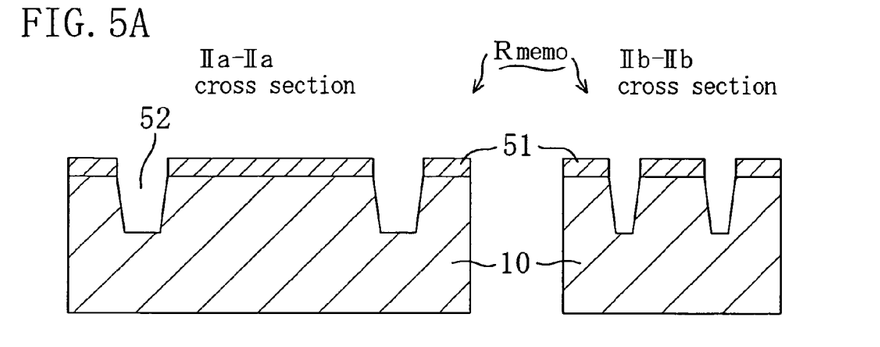
FIGS. 5A through 5C are cross sectional views illustrating the first half of process steps for fabricating a semiconductor device according to a second embodiment.

Initially, in a process step shown in FIG. 5A, after a $SiO_2$ film having a thickness of 200 nm, for example, is formed on a p-type silicon substrate 10, a resist mask (not shown) having a region of the substrate that is to form a capacitor trench opened is formed. The $SiO_2$ film is patterned by using the resist mask, thereby forming an oxide film mask 51. A capacitor trench 52 is formed in the silicon substrate 10 by dry etching using the oxide film mask 51.

Figure 5B:
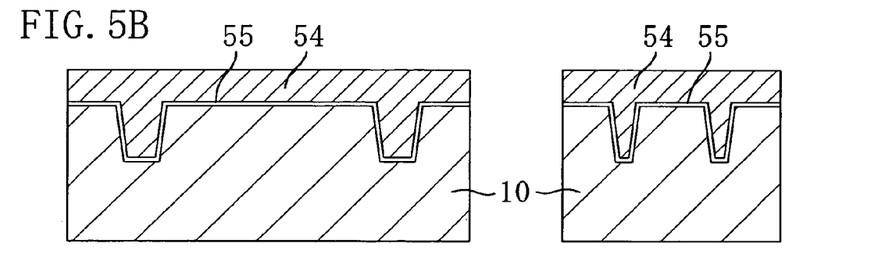

Next, in a process step shown in FIG. 5B, after the oxide film mask 51 is removed, a silicon oxide film 55 having a thickness of 20 nm and a silicon nitride film 54 having a thickness of 95 nm are successively formed in the capacitor trench 52 and on the silicon substrate 10, and then the silicon nitride film 54 is planarized by CMP, for example.

Figure 5C:
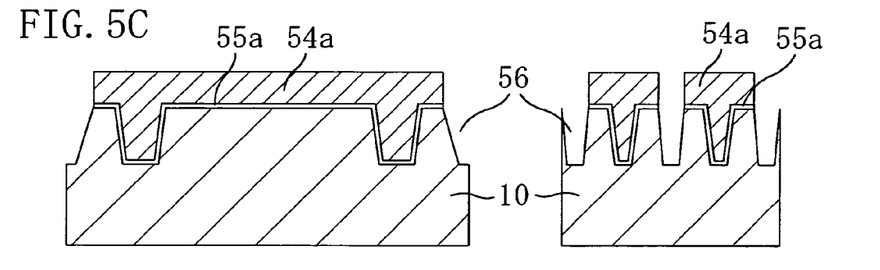

Next, in a process step shown in FIG. 5C, a resist mask (not shown) having a region of the substrate that is to form a shallow trench opened is formed on the silicon nitride film 54, and a nitride film mask 54a and an underlying oxide film 55a are formed by dry etching using the resist mask. Dry etching is performed using the nitride film mask 54a or the like as a mask, thereby a shallow trench 56 in the silicon substrate 10. At this time, a shallow trench is formed also in the logic circuit region, although this is not shown.

Figure 6A:
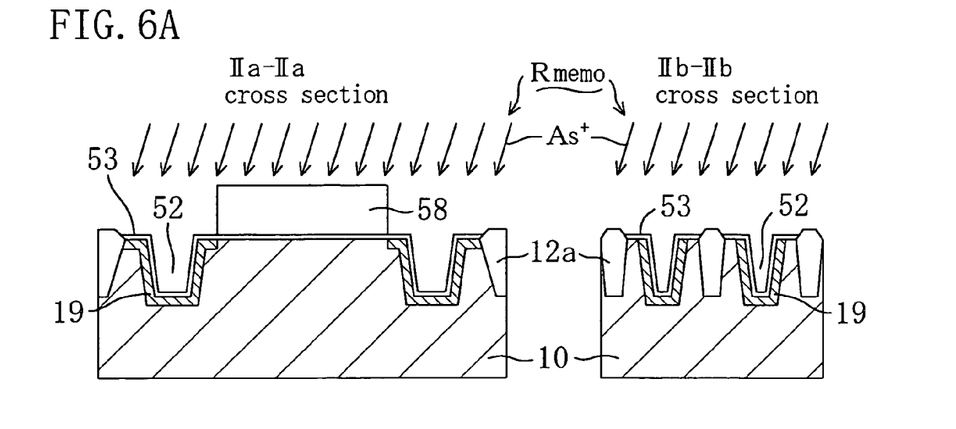
FIGS. 6A through 6C are cross sectional views illustrating the latter half of process steps for fabricating a semiconductor device according to the second embodiment.

Next, in a process step shown in FIG. 6A, the same processes as in the process steps shown in FIG. 3E of the first embodiment are carried out. After a silicon oxide film (not shown) is deposited on the substrate, the silicon oxide film and the nitride film mask 54a are planarized by CMP. Thereby, the shallow trench 56 is filled with the silicon oxide film so as to form a shallow trench isolation 12a. At this time, a shallow trench isolation 12b as shown in FIG. 2A is formed also in the logic circuit region Rlogc. Thereafter, the nitride film mask 54a is selectively removed by wet etching, and then the underlying oxide film 55a is removed by wet etching.

Thereafter, an implantation protection oxide film 53 is formed in the capacitor trench 52 and on the silicon substrate 10. A resist mask 58 is formed on the implantation protection oxide film 53, and an n-type diffusion layer 19 that becomes a storage node is formed by implanting arsenic ions (As$^+$) using this resist mask 58 as an implantation mask. At this time, a margin is set for a horizontal size of the resist mask 58 so that a source diffusion layer of the memory cell transistor to be formed later and the n-type diffusion layer 19 overlap with each other.

Figure 6B:
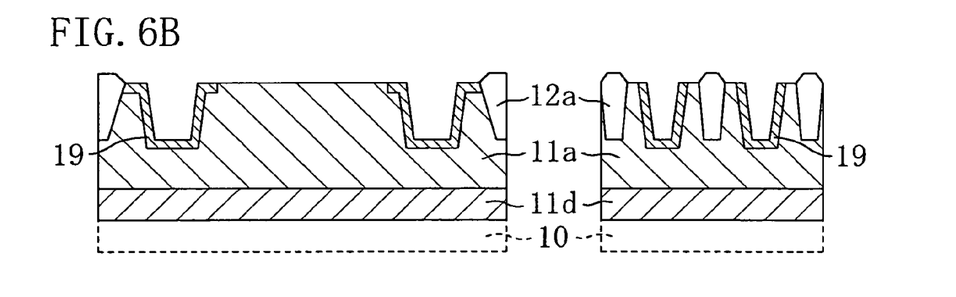

Next, in a process step shown in FIG. 6B, after the resist mask 58 is removed, the implantation protection oxide film 53 is removed by wet etching. Phosphorus ions (P$^+$) are implanted into the memory region Rmemo and a part of the logic circuit region Rlogc of the silicon substrate 10 by using a resist mask (not shown) covering a part of the logic circuit region Rlogc, thereby forming a deep n-well 11d (see FIG. 2A) over the memory region Rmemo and a part of the logic circuit region Rlogc. Boron ions (B$^+$) are implanted into the memory region Rmemo and a part of the logic circuit region Rlogc of the silicon substrate 10 by using a resist mask (not shown) covering a p-channel type transistor formation region of the logic circuit region Rlogc, thereby forming a p-well 11a located in the memory region Rmemo and a p-well 11c located in the logic circuit region Rlogc (see FIG. 2A). Phosphorus ions (P$^+$) are implanted by using a resist mask (not shown) covering the memory region Rmemo and an n-channel type transistor formation region of the logic circuit Rlogc, thereby forming an n-well 11b (see FIG. 2A) in the logic circuit region Rlogc. In the memory region Rmemo and the logic circuit region Rlogc, impurities for channel stoppers are implanted immediately below the shallow trench isolations 12a and 12b, and impurities for punch-through stoppers are implanted below channel regions of the transistors, although they are not shown in FIG. 2A.

Although in this embodiment the deep well lid, the p-wells 11a and 11c, and the n-well 11b are formed after the shallow trench isolation 12a is formed, these wells may be formed before the capacitor trench 52 shown in FIG. 5A is formed.

Figure 6C:
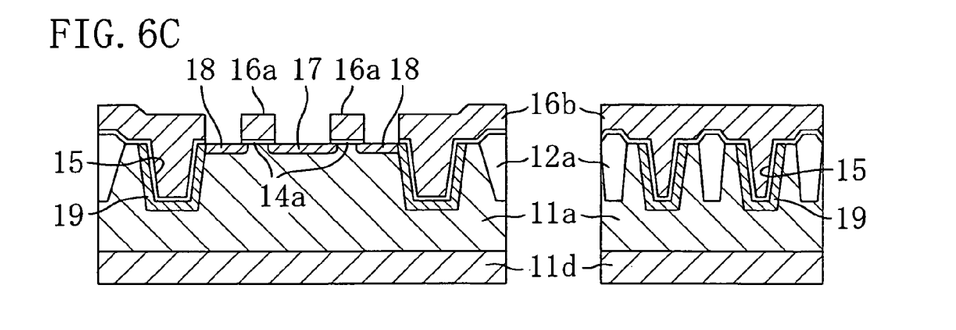

Next, in a process step shown in FIG. 6C, a thermal oxide film which serves as a capacitance dielectric 15 and a gate dielectric 14a both located in the memory region Rmemo and a gate dielectric 14b located in the logic circuit region Rlogc is formed, and thereafter a polysilicon film having a thickness of 200 nm is deposited thereon. Thereafter, the polysilicon film and the thermal oxide film are patterned, thereby forming the capacitance dielectric 15 and a plate electrode 16b of a trench capacitor and the gate dielectric 14a and a gate electrode 16a of a memory cell transistor in the memory region Rmemo. The gate dielectric 14b and a gate electrode 16c for each of a p-channel type MIS transistor and an n-channel type MIS transistor are formed in the logic circuit region Rlogc (see FIG. 2A), although they are not shown in FIG. 6C. Prior to the patterning of the polysilicon film, impurity ions may be implanted into part of the polysilicon film which is to become gate electrodes of both the p-channel type MIS transistor and the n-channel type MIS transistor or a gate electrode of the p-channel type MIS transistor, so as to reduce the resistance of the gate electrode or gate electrodes.

Thereafter, arsenic ions are implanted into the memory cell transistor located in the memory region Rmemo and the p-channel type MIS transistor located in the logic circuit region Rlogc with a concentration for extension. Thereby, a low-concentration drain diffusion layer 17b and a source diffusion layer 18 are formed in the memory region Rmemo, and an extension region of the n-channel type MIS transistor is formed in the logic circuit region Rlogc. At this time, the source diffusion layer 18 of the memory cell transistor is formed so as to overlap with the n-type diffusion layer 19 that is a storage node. In the logic circuit region Rlogc, boron fluoride ions are implanted with a concentration for extension of the p-channel type MIS transistor, thereby forming an extension region of the p-channel type MIS transistor, although this is not shown.

Although later process steps are not shown, the same process steps as in those shown in FIGS. 4B through 4D according to the first embodiment are carried out. Thereby, the structure of the semiconductor device shown in FIGS. 1, 2A and 2B can be obtained. Also in this embodiment, the source diffusion layer 18 of the memory cell transistor is covered with the two dielectric sidewalls 25a and 25b (see FIG. 2A). Therefore, the source diffusion layer 18 is not doped with high-concentration n-type impurities, no high-concentration source diffusion layer is formed, and no silicide layer is formed on the source diffusion layer 18.

Although in this embodiment a description is given using a thermal oxide film as the gate dielectric 14a and the capacitance dielectric 15, for example, an oxide film, an oxynitride film, an ON film obtained by successively stacking an oxide film and a nitride film, an ONO film obtained by successively stacking an oxide film, a nitride film and an oxide film, an HfO$_2$ film or a ZrO$_2$ film that are high-dielectric films, or the like can be employed as a common dielectric. In the logic circuit region Rlogc, plural kinds of gate dielectrics of different thicknesses, such as two or three kinds, are often provided in accordance with types of transistors. The gate dielectric 14b of each of the transistors located in the logic circuit region Rlogc may also be formed of an oxide film, an oxynitride film, an ON film obtained by successively stacking an oxide film and a nitride film, an ONO film obtained by successively stacking an oxide film, a nitride film and an oxide film, an HfO$_2$ film or a ZrO$_2$ film that are high-dielectric films, or the like.

According to the fabricating method of this embodiment, two oxidation process steps and two oxide film removal process steps are carried out between the process step shown in FIG. 5B and the process step shown in FIG. 6B. Therefore, the corner shape of the trench can be easily rounded, and also the wall surface of the trench is cleaned and smoothed. Thus, the properties of the capacitance dielectric 15 to be formed later are improved. This improvement of the properties means that, for example, the film thickness is substantially made uniform to reduce a current leakage through the capacitance dielectric 15, and that variations in capacitance values become small to stabilize a charge storage function.

The source diffusion layer 18 is covered with the two dielectric sidewalls 25a and 25b. Therefore, it can be restrained that in the process steps after sidewall formation, the source diffusion layer 18 is turned into silicide and various types of impurities enter the source diffusion layer 18. Furthermore, since the entry of the various types of impurities can be suppressed and no silicide layer is formed on the source diffusion layer 18, a current leakage through the source diffusion layer 18 can be reduced.

Furthermore, according to the fabricating method of this embodiment, as in the first embodiment, the bit line contact 31 and the plate contact 34 each passing through the inter-level dielectric 30 can be formed in a common process step, and the bit line 32 and the shield line 33 can also be formed of a common metal film at the same time. Therefore, a structure of the plate electrode 16b for stabilizing the potential thereof can be achieved without causing the number of process steps to increase.

The capacitor trench 52 located in the memory region Rmemo can be formed before the gate dielectric of the MIS transistor located in the logic circuit region Rmemo is formed. Therefore, a DRAM-embedded logic LSI having a trench capacitor can be fabricated at low cost without making the performance of the transistor worse due to diffusion of impurities into the source and drain diffusion layers located in the logic circuit region Rlogc or the like.

-Another Embodiment-

Although in the above embodiments a description is given of an example in which the present invention is applied to a merged DRAM/logic semiconductor device having a memory region and a logic circuit region, a semiconductor device of the present invention can also be applied to a semiconductor device having not a logic circuit region but only a DRAM.

Although in the above embodiments a description is given of an example in which the present invention is applied to a memory device comprising a trench storage capacitor, the present invention is not restricted to the above-described embodiments but can also be applied to a memory device and a merged RAM/logic semiconductor device comprising a planar storage capacitor and a stacked storage capacitor.

Although in the above embodiments the memory cell transistor is an n-channel type transistor, the memory cell transistor may be a p-channel type transistor. When the memory cell transistor is a p-channel type transistor, a triple-well structure need not be employed. Therefore, the number of masks in the fabricating process steps can be reduced. In this case, an n-well, a p-type diffusion layer and a high-concentration p-type diffusion layer need be formed instead of the p-well 11a, the n-type diffusion layer 19 and the high-concentration drain diffusion layer 17a, respectively, and both of the source diffusion layer 18 and the low-concentration drain diffusion layer 17b of the memory cell transistor need be located in a p-type region. A well equivalent to the deep n-well 11d is not required.

Although an n-type diffusion layer that becomes a storage node is formed by ion implantation using an oxide film mask in the process steps shown in FIGS. 3B and 6A according to the above-described embodiments, a plasma doping method can be employed instead of the ion implantation method.

Although the capacitance dielectric and the gate dielectric are formed by patterning the common (same) dielectric in the above-described embodiments, they may be formed of different films, respectively.

Although an n-type diffusion layer 19 functioning as a storage node is formed on the surface of the capacitor trench 52 of the trench capacitor Cpt in the above-described embodiments, a diffusion layer functioning as a storage node need not always be formed. In this way, when a diffusion layer functioning as a storage node is not formed, a potential is applied to the plate electrode, thereby forming an inversion layer on the surface of the substrate below the capacitance dielectric. This inversion layer is electrically connected to a source diffusion layer, thereby functioning as a storage node electrode.

INDUSTRIAL APPLICABILITY

The semiconductor device of the present invention can be utilized for a DRAM and a merged DRAM/logic device.

What is claimed is:

1. A semiconductor device comprising a DRAM memory cell including a memory cell transistor and a capacitor in a semiconductor layer, wherein:
   the memory cell transistor comprises:
   a gate dielectric provided on the semiconductor layer;
   a gate electrode provided on the gate dielectric;
   a source diffusion layer and a drain diffusion layer provided to either side of the gate electrode in the semiconductor layer; and
   a first sidewall covering the sides of the gate electrode, the capacitor comprises:
   a plate electrode including a lower part with which a capacitor trench formed by entrenching the semiconductor layer is filled and an upper part opposed to the gate electrode;
   a capacitance dielectric formed along the wall surfaces of the capacitor trench below the plate electrode and interposed between the lower part of the plate electrode and the semiconductor layer; and
   a second sidewall covering the sides of the upper part of the plate electrode,
   the first sidewall is formed of a dielectric in common with the second sidewall, and
   the whole source diffusion layer is covered with the first and second sidewalls.

2. The semiconductor device of claim 1 further comprising:
   a diffusion layer for a storage node that is formed along the wall surfaces of the capacitor trench in the semiconductor layer so as to be opposed to the lower part of the plate electrode via the capacitance dielectric.

3. The semiconductor device of claim 1, wherein:
   the drain diffusion layer includes a first impurity diffusion layer formed in self-alignment with the gate electrode and a second impurity diffusion layer formed in self-alignment with the first sidewall and containing higher-concentration impurities than those of the first impurity diffusion layer; and
   the source diffusion layer is formed in self-alignment with the gate electrode.

4. The semiconductor device of claim 1, wherein:
   a silicide layer is provided on at least a part of the drain diffusion layer of the memory cell transistor; and
   no suicide layer is provided on the source diffusion layer of the memory cell transistor.

5. The semiconductor device of claim 1, further comprising:
   an inter-level dielectric covering the memory cell transistor and the memory cell capacitor;
   plural bit lines formed on the inter-level dielectric;
   a shield line interposed between the plural bit lines on the inter-level dielectric, the shield line being formed of a conductor film in common with the bit lines; and
   a connection member passing though the inter-level dielectric and connecting the shield line to the plate electrode.

6. The semiconductor device of claim 1, wherein the plate electrode of the capacitor and the gate electrode of the memory cell transistor are formed of a common conductor film.

7. The semiconductor device of claim 6 further comprising:
a logic transistor including a gate electrode provided on the semiconductor layer and source and drain regions provided in the semiconductor layer,
wherein the gate electrode of the logic transistor is formed of a conductor film in common with the plate electrode of the capacitor and the gate electrode of the memory cell transistor.

8. The semiconductor device of claim 1, wherein the gate dielectric and the capacitance dielectric are formed using a common dielectric.

9. A semiconductor device comprising:
a DRAM memory cell including a memory cell transistor and a capacitor in a semiconductor layer;
an inter-level dielectric covering the memory cell transistor and the memory cell capacitor;
plural bit lines formed on the inter-level dielectric;
a shield line interposed between the plural bit lines on the inter-level dielectric, the shield line being formed of a conductor film in common with the bit lines; and
a connection member passing through the inter-level dielectric and connecting the shield line to the plate electrode, wherein:
the memory cell transistor comprises:
a gate dielectric provided on the semiconductor layer;
a gate electrode provided on the gate dielectric;
a source diffusion layer and a drain diffusion layer provided to either side of the gate electrode in the semiconductor layer; and
a first sidewall covering the sides of the gate electrode, the capacitor comprises:
a plate electrode including a lower part with which a capacitor trench formed by entrenching the semiconductor layer is filled and an upper part opposed to the gate electrode;
a capacitance dielectric formed along the wall surfaces of the capacitor trench below the plate electrode and interposed between the lower part of the plate electrode and the semiconductor layer; and
a second sidewall consisting of a dielectric covering the sides of the upper part of the plate electrode,
the whole source diffusion layer is covered with the first and second sidewalls.

10. The semiconductor device of claim 9 further comprising:
a diffusion layer for a storage node that is formed along the wall surfaces of the capacitor trench in the semiconductor layer so as to be opposed to the lower part of the plate electrode via the capacitance dielectric.

11. The semiconductor device of claim 9, wherein:
the drain diffusion layer includes a first impurity diffusion layer formed in self-alignment with the gate electrode and a second impurity diffusion layer formed in self-alignment with the first sidewall and containing higher-concentration impurities than those of the first impurity diffusion layer; and
the source diffusion layer is formed in self-alignment with the gate electrode.

12. The semiconductor device of claim 9, wherein:
a silicide layer is provided on at least a part of the drain diffusion layer of the memory cell transistor; and
no silicide layer is provided on the source diffusion layer of the memory cell transistor.

13. The semiconductor device of claim 9, wherein the plate electrode of the capacitor and the gate electrode of the memory cell transistor are formed of a common conductor film.

14. The semiconductor device of claim 13 further comprising:
a logic transistor including a gate electrode provided on the semiconductor layer and source and drain regions provided in the semiconductor layer,
wherein the gate electrode of the logic transistor is formed of a conductor film in common with the plate electrode of the capacitor and the gate electrode of the memory cell transistor.

15. The semiconductor device of claim 9, wherein the gate dielectric and the capacitance dielectric are formed using a common dielectric.

* * * * *

UNITED STATES PATENT AND TRADEMARK OFFICE
CERTIFICATE OF CORRECTION

PATENT NO. : 6,974,987 B2
DATED : December 13, 2005
INVENTOR(S) : Hisashi Ogawa et al.

It is certified that error appears in the above-identified patent and that said Letters Patent is hereby corrected as shown below:

Title page,
Item [56], References Cited, FOREIGN PATENT DOCUMENTS, change
"JP   8-74172      3/1997" to -- JP    9-74172      3/1997 --; and change
"JP   100988164 A   *    4/1988    H01L 27/107" to
-- JP  10098164 A    *    4/1998    H01L 27/108 --.

Signed and Sealed this

Eighteenth Day of April, 2006

JON W. DUDAS
*Director of the United States Patent and Trademark Office*